(12) United States Patent
Mudimela Venkata et al.

(10) Patent No.: US 11,303,277 B2
(45) Date of Patent: *Apr. 12, 2022

(54) VOLTAGE LEVEL SHIFTER

(71) Applicant: TEXAS INSTRUMENTS INCORPORATED, Dallas, TX (US)

(72) Inventors: Krishna Reddy Mudimela Venkata, Bengaluru (IN); Sneha Shetty, Bengaluru (IN); Sankar Debnath, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/074,711

(22) Filed: Oct. 20, 2020

(65) Prior Publication Data

US 2021/0036704 A1 Feb. 4, 2021

Related U.S. Application Data

(63) Continuation of application No. 16/409,964, filed on May 13, 2019, now Pat. No. 10,848,156.

(51) Int. Cl.
*H03K 19/0185* (2006.01)
*H03K 3/037* (2006.01)

(52) U.S. Cl.
CPC ..... *H03K 19/018521* (2013.01); *H03K 3/037* (2013.01)

(58) Field of Classification Search
CPC ....... H03K 19/0185; H03K 19/018507; H03K 19/018514; H03K 19/018521; H03K 19/018528; H03K 3/02; H03K 3/027; H03K 3/037; H03K 3/0372; H03K 3/0375; H03K 3/0377; H03K 3/038
See application file for complete search history.

(56) References Cited

U.S. PATENT DOCUMENTS

| | | | |
|---|---|---|---|
| 8,319,540 | B2 | 11/2012 | Barrow |
| 2002/0135555 | A1 | 9/2002 | Yang et al. |
| 2008/0211541 | A1 | 9/2008 | Chauhan |
| 2015/0062761 | A1 | 3/2015 | Chen |
| 2018/0115314 | A1 | 4/2018 | Koudate |

OTHER PUBLICATIONS

PCT International Search Report; PCT/US 2020/032307; dated Jul. 30, 2020; 2 pages.

*Primary Examiner* — Diana J. Cheng
(74) *Attorney, Agent, or Firm* — Ebby Abraham; Charles A. Brill; Frank D. Cimino

(57) ABSTRACT

A circuit includes first through fifth transistors. The first transistor has a first control input and first and second current terminals. The second transistor has a second control input and third and fourth current terminals. The third transistor has a third control input and fifth and sixth current terminals. The third control input is coupled to the third current terminal, and the fifth current terminal is coupled to a supply voltage node. The fourth transistor has a fourth control input and seventh and eighth current terminals. The fourth control input is coupled to the first current terminal, and the seventh current terminal coupled to the supply voltage node. The fifth transistor has a fifth control input and ninth and tenth current terminals. The fifth control input is coupled to the first control input, and the tenth current terminal coupled to the second current terminal.

6 Claims, 2 Drawing Sheets

VOLTAGE LEVEL SHIFTER

CROSS-REFERENCE TO RELATED APPLICATIONS

This application is a continuation of and claims priority to U.S. patent application Ser. No. 16/409,964 filed May 13, 2019, which is incorporated herein by reference in its entirety.

BACKGROUND

A voltage level shifter (or simply "level shifter") is a circuit that translates a signal from one voltage domain to another voltage domain. The voltage of the output signal may be larger or smaller than the voltage of the input signal. A level shifter can be used, for example, when an input signal to a circuit has been generated in accordance with a particular voltage domain which differs from the supply voltage domain of the circuit itself. An n-type metal oxide semiconductor field effect transistor (NMOS) often has its source connected to the ground potential. As such, turning the NMOS device on simply requires a gate voltage in excess of the threshold voltage for the transistor, and the NMOS device is turned off with a gate voltage below the threshold, closer to ground. A p-type metal oxide semiconductor field effect transistor (PMOS) often has its source connected to the supply voltage. As such, turning the PMOS device off requires a gate voltage closer to the supply voltage (La, within the transistor's threshold voltage of the supply voltage). In a level shifter, the voltage levels to turn an NMOS device on and off, thus, will be different than the voltage levels to turn on and off a PMOS device.

SUMMARY

In one example, a circuit includes first through fifth transistors. The first transistor has a first control input and first and second current terminals. The second transistor has a second control input and third and fourth current terminals. The third transistor has a third control input and fifth and sixth current terminals. The third control input is coupled to the third current terminal, and the fifth current terminal is coupled to a supply voltage node. The fourth transistor has a fourth control input and seventh and eighth current terminals. The fourth control input is coupled to the first current terminal, and the seventh current terminal coupled to the supply voltage node. The fifth transistor has a fifth control input and ninth and tenth current terminals. The fifth control input is coupled to the first control input, and the tenth current terminal coupled to the second current terminal.

BRIEF DESCRIPTION OF THE DRAWINGS

For a detailed description of various examples, reference will now be made to the accompanying drawings in which.

DETAILED DESCRIPTION

Figure 1:
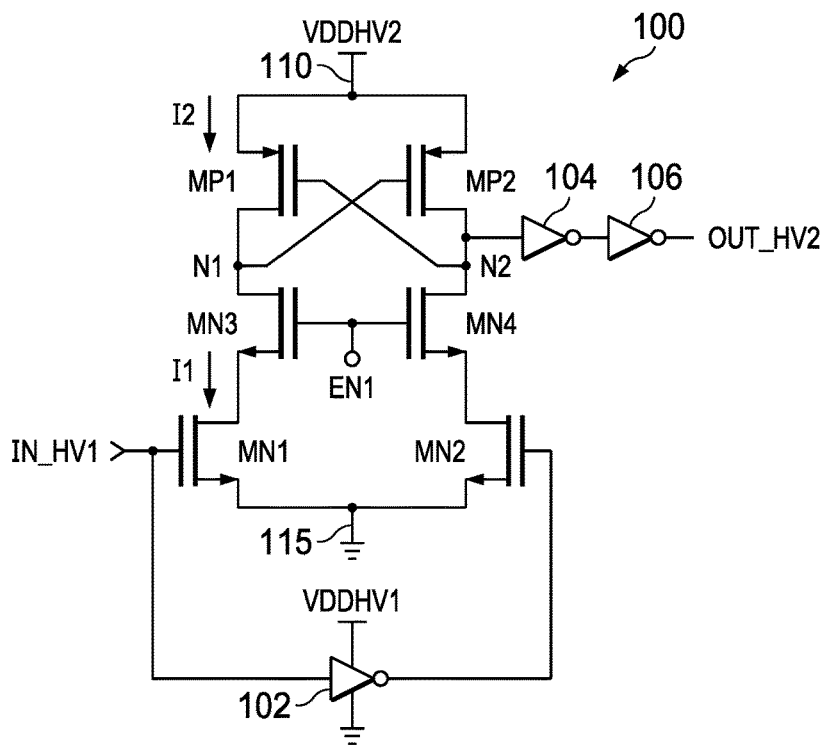
FIG. 1 illustrates an example of a level shifter.

FIG. 1 shows an example of a high to low level shifter 100 which translates the incoming signal from a voltage domain that is lower than the supply voltage domain. The level shifter 100 includes NMOS transistors MN1, MN2, MN3, and MN4, PMOS transistors MP1 and MP2, and inverters 102, 104, and 106. Because the input signal is in a higher voltage domain than the voltage domain of the output signal (OUT_HV2), MN1 and MN2 are high voltage transistors for reliability reasons, and thus the threshold voltage of MN1 and MN2 is higher than for MN3, MN4, MP1, and MP2. The sources of MP1 and MP2 are connected to the supply voltage node 110 (VDDHV2). The drain of MP1 is connected to the drain of MN3 at node N1, and the drain of MP2 is connected to the drain of MN4 at node N2. The source of MN3 is connected to the drain of MN1, and the source of MN4 is connected to the drain of MN2. The sources of MN1 and MN2 are connected to the ground node 115. The gate of MP1 is connected to N2, and the gate of MP2 is connected to N1. The gates of MN3 and MN4 are connected together and receive an enable (EN1) input signal. When EN1 is asserted high, MN3 and MN4 are both on; otherwise with EN1 being low, MN3 and MN4 are both off, and the level shifter is disabled. The gate of MN1 is configured to receive an input signal IN_HV1. Inverter 102 inverts IN_HV1 to drive the gate of MN2. As such, only one of MN1 and MN2 are on at any point in time. Series connected inverters 104 and 106 are connected to N2, and the output of inverter 106 provides the output signal OUT_HV2 from the level shifter 100.

When IN_HV1 is high, OUT_HV2 also is high, and when IN_HV1 is low, OUT_HV2 also is low. When high, however, IN_HV1 is at a different voltage than OUT_HV2. The voltage level of OUT_HV2 is generally lower than the voltage level of IN_HV1 (although in some conditions, OUT_HV2 is higher than IN_HV1). VDDHV2 is the supply voltage for the level shifter 100, and dictates the voltage level of OUT_HV2. When IN_HV1 is logic high, MN1 is on and MN2 is off. With EN1 asserted high, both MN3 and MN4 are on. With MN1 and MN3 being on, N1 is pulled low to ground. As the voltage on N1 drives the gate of MP2, the gate-to-source voltage (VGS) of MP2 is sufficiently high to turn on MP2. With MP2 on, N2 is pulled high to VDDHV2, and OUT_HV2 is thus also VDDHV2. Conversely, when IN_HV1 is logic low, MN1 is off and MN2 is on. With MN2 and MN4 being on, N2 is pulled low to ground, and thus OUT_HV2 also is low. As the voltage on N2 drives the gate of MP1, the VGS of MP1 is sufficiently high to turn on MP1. With MP1 on, N1 is pulled high which, in turn, turns off MP2.

The NMOS devices MN1 and MN2 must be "strong" enough to cause the drains of MP1 and MP2 to discharge when IN_HV1 transitions between low and high. For example, if IN_HV1 is currently low, as explained above, MN2, MN4, and MP1 are on. In this state N1 is pulled high toward VDDHV2. During the transition of IN_HV1 from low to high, MN1 turns on and the charge on the drain of MP1 should discharge to ground through MN3 and MN1. For MP1's drain to discharge, the drain current (I1) through MN1 should be larger than the drain current (I2) through MP1. I1 is the sum of I2 and the discharge current from the drain of MP1 (the source-to-drain of MP1 represents a capacitance that is charged when MN1 is off, and then discharges when MN1 is turned on).

The drain current through a MOS transistor is a function, at least in part, of its VGS and its size (size referring to the ratio of the transistor's channel width (W) to the channel length (L)). Under normal operating conditions, the VGS of MN1 and MN2 is higher than the VGS of MP1, and can easily pull down the voltage on the drains of MP1 and MP2. Under conditions when the level shifter is enabled for lower voltage values of VDDHV1 (close to the threshold voltage of MN1 and MN2), MN1 and MN2 are much weaker when their respective inputs become logic high (than with VDDHV1 at higher voltages). In this latter condition (low value of VDDHV1), because VDDHV1 is smaller than VDDHV2, when IN_HV1 transitions from low to high, the VGS of MP1 is larger than the VGS of MN1. Thus, to discharge the drain of MP1, the size of MN1 must be substantially larger than the size of MP2 so that the drain current of MN1 will be larger than the drain current of MP1, which in turn will cause N1 to discharge. This problem is thus addressed in the example level shifter of 100 of FIG. 1 by making MN1 larger than MP1. The same problem exists on the righthand side of the level shifter 100 for a high to low transition of IN_HV1, which causes MN2 to turn on in an attempt to discharge the drain of MP2. MN1 and MN2 in this design are larger than MP1 and MP2. There is thus a size penalty with the level shifter 100 of FIG. 1. Further, the leakage current and average switching current is quite large as well.

Figure 2:
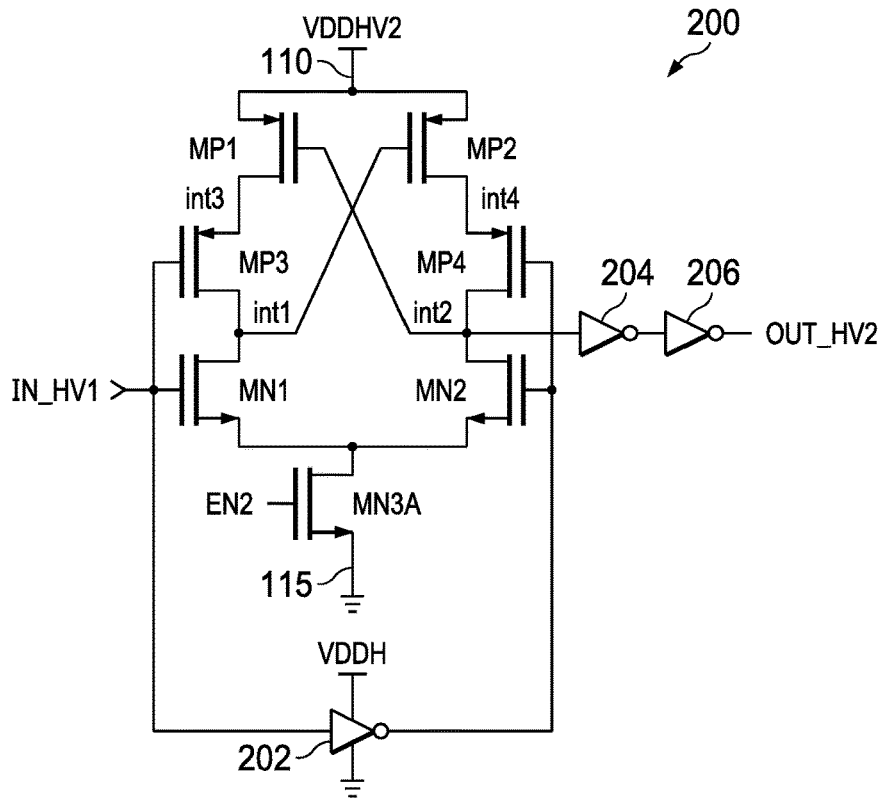
FIG. 2 illustrates another example of a level shifter.

FIG. 2 shows an example of a level shifter 200 that addresses the aforementioned problems. The level shifter 200 includes NMOS transistors MN1, MN2, and MN3A, PMOS transistors MP1, MP2, MP3, and MP4, and inverters 202, 204, and 206. The sources of MP1 and MP2 are connected to the supply voltage node 110 (VDDHV2). The drain of MP1 is connected to the source of MP3 at intermediate node int3, and the drain of MP2 is connected to the source of MP4 at intermediate node int4. The drain of MP3 is connected to the drain of MN1 at intermediate node int1, and the drain of MP4 is connected to the drain of MN2 at intermediate node int2. The sources of MN1 and MN2 are connected to drain of MN3A. The source of MN3 is connected the ground node 115, and an enable signal EN2 is provided to the gate of MN3A to enable operation of the level shifter 100. EN2 being high (e.g., larger than the threshold voltage of MN3A) causes MN3A to be on, and EN2 being low (e.g., ground potential) causes MN3A to be off. The level shifter 200 is enabled with EN2 asserted high, and disabled otherwise.

The gate of MP1 is connected to int2, and the gate of MP2 is connected to int1. The gates of MP3 and MN1 are connected together and receive IN_HV1. Inverter 202 inverts IN_HV1 to drive the gates of MP4 and MN2, which are also connected together. Series connected inverters 204 and 206 are connected to int2, and the output of inverter 206 provides the output signal OUT_HV2 from the level shifter 200.

When IN_HV1 is high, OUT_HV2 also is high, and vice versa. When high, however, IN_HV1 is at a different voltage than OUT_HV2. The voltage level of OUT_HV2 may be higher or lower than the voltage level of IN_HV1. VDDHV2 is the supply voltage for the level shifter 200, and dictates the voltage level of OUT_HV2. When IN_HV1 is logic high, MN1 is on, and MN2 and MP3 are off. With MN1 being on, in1 is pulled low to ground. As the voltage on int1 drives the gate of MP2, the VGS of MP2 is sufficiently high to turn on MP2. With MP2 on, the source voltage of MP4 increases thereby causing MP4 to turn on. As a result, int2 is pulled high to VDDHV2, and OUT_HV2 is thus also VDDHV2. Conversely, when IN_HV1 is logic low MN2 is on. With MN2 being on, int2 is pulled low to ground, and thus OUT_HV2 also is low. As the voltage on int2 drives the gate of MP1, the VGS of MP1 is sufficiently high to turn on MP1. With MP1 on, MP3 also turns on, and int1 is pulled high which, in turn, turns off MP2.

MP3 and MP4 in the example of FIG. 2 are used to isolate the input NMOS transistors MN1 and MN2 from the cross coupled PMOS transistors MP1 and MP2. When IN_HV1 is 0, MN1 is off, and MP1 and MP3 are on. As IN_HV1 transitions from low to high, MN1 turns on and MP3 turns off. As such, MN1 need only sink enough current to discharge the drain of MP3. With MP3 otherwise off, no current flows through MP3 from MP1. In contrast to the level shifter 100 of FIG. 1, MP3 and MP4 reduce or completely eliminate the drive fight between MN1 and MP1 and between MN2 and MP2.

Instead of having MN3 and MN4 in FIG. 1 being the enable transistors, in FIG. 2, that feature has been implemented with single tail transistor MN3A connected between the sources of MN1, MN2 and the ground node 115. Using a single tail transistor MN3A (versus two transistors MN3 and MN4 in FIG. 1) provides an area benefit, as well as improved performance from common mode noise as the level shifter 200 is perfectly differential.

In the example of FIG. 2, while MN2 turns on (when IN_HV1 transitions from high to low), MP4 turns off. At that point, MP4 does not actively pull intermediate node int4 low. This issue is addressed by having the input to inverter 204 connected to intermediate node int2 instead of intermediate node int4. However, the rising transition of OUT_HV2 will be slower if intermediate node int2 is used rather than intermediate node int4.

Figure 3:
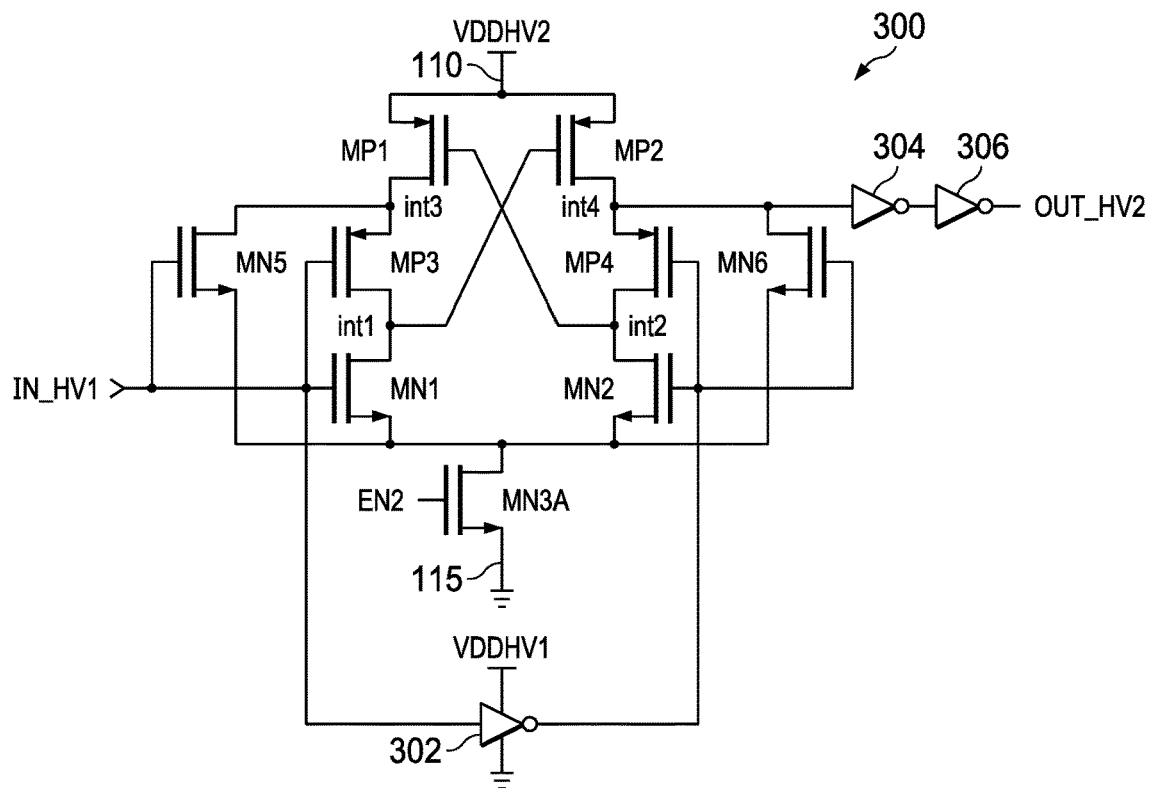
FIG. 3 illustrates another example of a level shifter.

FIG. 3 shows an example of a level shifter 300, which includes NMOS transistors MN1, MN2, MN3A, MNS, and MN6, PMOS transistors MP1, MP2, MP3, and MP4, and inverters 302, 304, and 306. The sources of MP1 and MP2 are connected to the supply voltage node 110 (VDDHV2). The drain of MP1 is connected to the source of MP3 at intermediate node int3, and the drain of MP2 is connected to the source of MP4 at intermediate node int4. The drain of MP3 is connected to the drain of MN1 at intermediate node int1, and the drain of MP4 is connected to the drain of MN2 at intermediate node int2. The sources of MN1 and MN2 are connected to drain of MN3A. The source of MN3 is connected the ground node 115, and an enable signal EN2 is provided to the gate of MN3A to enable operation of the level shifter 100. As described above, EN2 being high causes MN3A to be on, and EN2 being low causes MN3A to be off. The level shifter 300 is enabled with EN2 asserted high, and disabled otherwise.

Intermediate node int4 is connected to the input of inverter 304, and the output of inverter 304 is connected to the input of inverter 306. The output of inverter 306 provides the output signal OUT_HV2 from the level shifter 300.

As was the case for FIG. 2, MP3 and MP4 in the example of FIG. 3 are used to isolate the input NMOS transistors MN1 and MN2 from the cross coupled PMOS transistors MP1 and MP2. When IN_HV1 is 0, MN1 is off, and MP1 and MP3 are on. As IN_HV1 transitions from low to high, MN1 turns on and MP3 turns off. As such, MN1 need only sink enough current to discharge the drain of MP3. With MP3 otherwise off, no current flows through MP3 from MP1. In contrast to the level shifter 100 of FIG. 1, MP3 and MP4 reduce or completely eliminate the drive fight between MN1 and MP1 and between MN2 and MP2.

The drain of MN5 connects to the drain of MP1 and to the source of MP3 at int3. The source of MN5 connects to the source of MN1. The drain of MN6 connects to the drain of MP2 and to the source of MP4 at int4. The source of MN6 connects to the source of MN2. As explained above regarding FIG. 2, intermediate node int4 is not actively pulled low when IN_HV1 transitions from high to low thereby turning off MP4. This issue was addressed in the example level shifter 200 of FIG. 2 by having the series connected inverters 204 and 206 connected to intermediate node int2 instead of intermediate node int4, but resulting in a lower slew rate for OUT_HV2 when making a low to high transition. MN5 and MN6 in FIG. 3 solve this problem. MN6 turns on wen MN2 is turned on and MP4 is turned off. As such, the charge on intermediate node int4 is discharged through MN6 to ground thereby quickly pulling the voltage on intermediate node int4 low. The same action occurs when MN1 is turned on and MP3 is turned off (MN5 is also turned on thereby quickly discharging intermediate nod int3). As a result of quickly discharging the intermediate node int4, the voltage on the source of MP4 is quickly pulled low which, in turn, causes MP4 to turn off sooner during the high to low transition of IN_HV1 than would have been the case in the example of FIG. 2. Similarly, with MN5 turning on during the low to high transition of IN_HV1, MP3 is caused to turn off sooner during that transition than would have otherwise been the case in the example of FIG. 2. Thus, the advantages of adding MN5 and MN6 are two-fold. First, discharge paths to int4 and int3 are provided. Second, isolation is improved for MN1, MP1, and for MN2, MP2.

Figure 4:
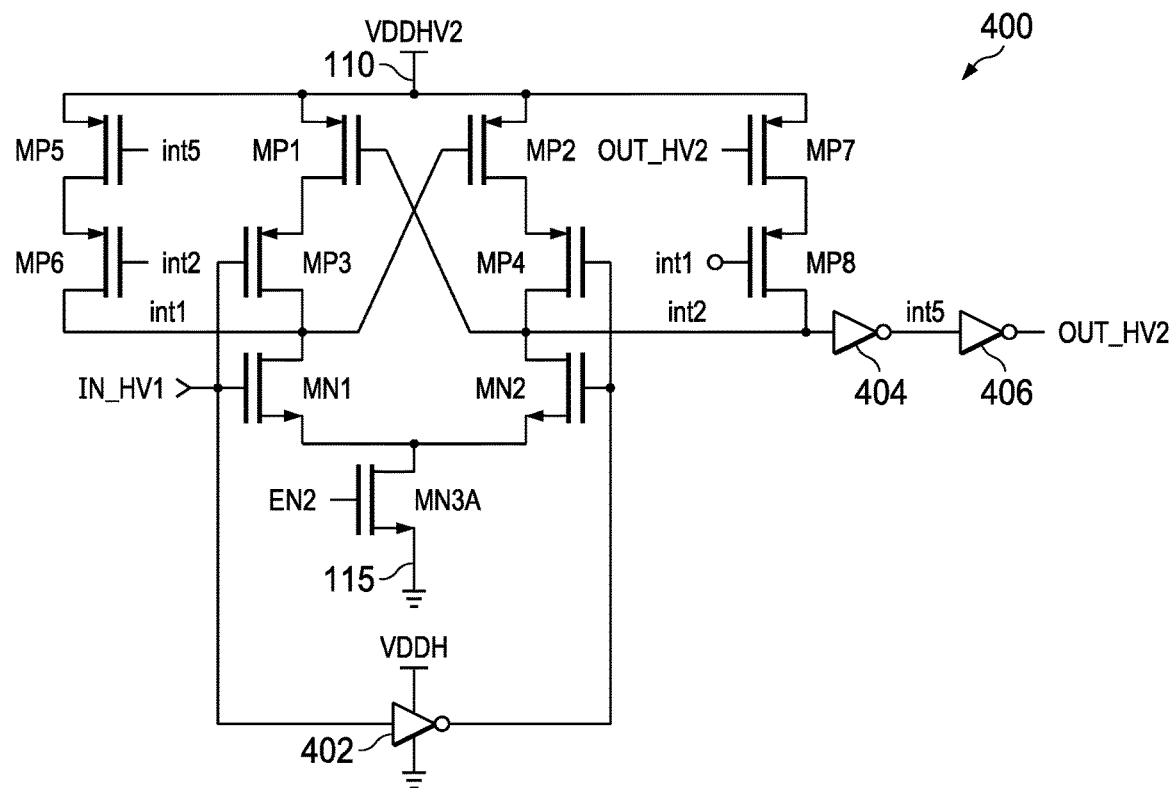
FIG. 4 illustrates another example of a level shifter.

FIG. 4 shows an example of a level shifter 400, which includes NMOS transistors MN1, MN2, and MN3A, PMOS transistors MP1, MP2, MP3, MP4, MPS, MP6, MP7, and MP8, and inverters 402, 404, and 406. The sources of MP1 and MP2 are connected to the supply voltage node 110 (VDDHV2). The drain of MP1 is connected to the source of MP3, and the drain of MP2 is connected to the source of MP4. The drain of MP3 is connected to the drain of MN1 at intermediate node int1, and the drain of MP4 is connected to the drain of MN2 at intermediate node int2. The sources of MN1 and MN2 are connected to drain of MN3A. The source of MN3 is connected the ground node 115, and an enable signal EN2 is provided to the gate of MN3A to enable operation of the level shifter 100. As described above, EN2 being high causes MN3A to be on, and EN2 being low causes MN3A to be off. The level shifter 300 is enabled with EN2 asserted high, and disabled otherwise.

Intermediate node int2 is connected to the input of inverter 404, and the output of inverter 404 is connected to the input of inverter 406 at intermediate node int5. The output of inverter 406 provides the output signal OUT_HV2 from the level shifter 400. The gate of MP5 is connected to intermediate node int5. The gate of MP6 is connected to intermediate node int2. The gate of MP7 is connected to the output node of the level shifter 400 (OUT_HV2). The gate of MP8 is connected to intermediate node int1.

As was the case for FIG. 2, MP3 and MP4 in the example of FIG. 3 are used to isolate the input NMOS transistors MN1 and MN2 from the cross coupled PMOS transistors MP1 and MP2. When IN_HV1 is 0, MN1 is off, and MP1 and MP3 are on. As IN_HV1 transitions from low to high, MN1 turns on and MP3 turns off. As such, MN1 need only sink enough current to discharge the drain of MP3. With MP3 otherwise off, no current flows through MP3 from MP1. In contrast to the level shifter 100 of FIG. 1, MP3 and MP4 reduce or completely eliminate the drive fight between MN1 and MP1 and between MN2 and MP2.

MP7 and MP8 form a pull-up stack of transistors that are operative to quickly pull int2 (and thus OUT_HV2) from ground to VDDHV2. MP7 and MP8 assist the pull-up functionality of MP2 and MP4 in this regard. Similarly, MP5 and MP6 also form a pull-up stack of transistors that are operative to quickly pull inti from ground to VDDHV2. MP5 and MP6 assist the pull-up functionality of MP1 and MP3 in this regard. The operation of MP7 and MP8 will now be described when IN_HV1 transitions from low to high.

The same or similar explanation also applies to MP5 and MP6 when IN_HV1 transitions from high to low.

When IN_HV1 is low, MN2, MP3, and MP1 are on. With MN2 being on, int2 is low, and through inverters 404 and 406, OUT_HV2 also is low. Because OUT_HV2 is used as the gate voltage to MP7, MP7 is on. However, MP8 is off because intermediate node int1 is high through MP1 and MP3, both of which are on.

During the transition of IN_HV1 from low to high, once IN_HV1 reaches the threshold voltage of MN1, MN1 turns on thereby pulling intermediate node int1 low. With int1 being low, MP2 and MP8 are both turned on. MP4 also turns on. At this point, intermediate node int2 begins to charge up via two transistor stacks. One transistor stack comprises MP2 and MP4. The other transistor stack comprises MP7 and MP8. Thus, MP7 and MP8 help to quickly increase the voltage on intermediate node int2 (and thus OUT_HV2) from ground towards VDDHV2.

As OUT_HV2 begins to increase, once OUT_HV2 reaches one transistor threshold voltage from VDDHV2, the VGS of MP7 falls below its threshold voltage and MP7 turns off, thereby effectively disabling the transistor stack of MP7/MP8. Thus, the rising transition of OUT_HV2 is improved (i.e., its slew rate increases) due to the action of MP7 and MP8 during a portion of the transition phase of IN_HV1. The same explanation is applicable to MP5 and MP6 when IN_HV1 transitions from high to low.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a first switch having a first control input and first and second current terminals;
   a second switch having a second control input and third and fourth current terminals;
   a third switch having a third control input and fifth and sixth current terminals, the third control input coupled to the third current terminal, and the fifth current terminal coupled to a supply voltage node;
   a fourth switch having a fourth control input and seventh and eighth current terminals, the fourth control input coupled to the first current terminal, and the seventh current terminal coupled to the supply voltage node; and
   a fifth switch having a fifth control input and ninth and tenth current terminals, the fifth control input coupled to an output node of the circuit;
   a sixth switch having a sixth control input and eleventh and twelfth current terminals, the sixth control input coupled to the first current terminal, the eleventh current terminal coupled to the tenth current terminal, and the twelfth current terminal coupled to the third current terminal;
   an inverter having an input and an output, the input coupled to the twelfth current terminal; and
   a seventh switch having a seventh control input and thirteenth and fourteenth current terminals, the seventh control input coupled to the output of the inverter.

2. The circuit of claim 1, further comprising:
an eighth switch having an eighth control input and fifteenth and sixteenth current terminals, the eighth control input coupled to the third current terminal, the fifteenth current terminal coupled to the fourteenth current terminal, and the sixteenth current terminal coupled to the first current terminal.

3. The circuit of claim 2, further comprising a ninth switch having a ninth control input and seventeenth and eighteenth current terminals, the seventeenth current terminal coupled to the second and fourth current terminals.

4. The circuit of claim 1, further comprising an eighth switch having an eighth control input and fifteenth and sixteenth current terminals, the fifteenth current terminal coupled to the sixth current terminal, and the sixteenth current terminal coupled to the first current terminal.

5. The circuit of claim 4, further comprising a ninth switch having a ninth control input and seventeenth and eighteenth current terminals, the seventeenth current terminal coupled to the eighth current terminal, and the eighteenth current terminal coupled to the third current terminal.

6. The circuit of claim 5, wherein the first and second switches comprise n-type metal oxide semiconductor field effect transistors, and the eighth and ninth switches comprise p-type metal oxide semiconductor field effect transistors.

* * * * *